(12) United States Patent
Sasaki et al.

(10) Patent No.: US 7,754,015 B2
(45) Date of Patent: Jul. 13, 2010

(54) VACUUM VAPOR-DEPOSITION APPARATUS AND METHOD OF PRODUCING VAPOR-DEPOSITED FILM

(75) Inventors: Noboru Sasaki, Fukuoka (JP); Hiroshi Suzuki, Koga (JP); Fumitake Koizumi, Kumagaya (JP); Nobuhiko Imai, Tokyo (JP); Kunimasa Arai, Tatebayashi (JP); Hiroyuki Konagai, Kumagaya (JP)

(73) Assignees: Toppan Printing Co., Ltd., Tokyo (JP); Applied Materials GmbH & Co. KG, Alzenau (DE)

( * ) Notice: Subject to any disclaimer, the term of this patent is extended or adjusted under 35 U.S.C. 154(b) by 914 days.

(21) Appl. No.: 11/157,163

(22) Filed: Jun. 21, 2005

(65) Prior Publication Data

US 2005/0249875 A1    Nov. 10, 2005

Related U.S. Application Data

(63) Continuation of application No. PCT/JP03/16846, filed on Dec. 26, 2003.

(30) Foreign Application Priority Data

Dec. 26, 2002    (JP) .............................. 2002-376933

(51) Int. Cl.
*C23C 16/00* (2006.01)
*C23C 14/00* (2006.01)

(52) U.S. Cl. .................................. 118/718; 204/298.24

(58) Field of Classification Search .................. 118/718; 204/298.24

See application file for complete search history.

(56) References Cited

U.S. PATENT DOCUMENTS 4,277,516 A * 7/1981 Behn et al. .................... 427/81
4,864,967 A * 9/1989 Kleyer ........................ 118/718
5,951,835 A    9/1999 Namiki et al.
6,259,061 B1   7/2001 Osawa

FOREIGN PATENT DOCUMENTS

| CN | 2232924   |   | 8/1996  |
|----|-----------|---|---------|
| JP | 6-2954    |   | 10/1987 |
| JP | 2-14423   |   | 1/1990  |
| JP | 08311650 A | * | 11/1996 |
| JP | 9-176855  |   | 7/1997  |

(Continued)

OTHER PUBLICATIONS

Funo, Thin Film Forming Device (JPO Online Translation), Jul. 8, 1997.*

(Continued)

*Primary Examiner*—Karla Moore
(74) *Attorney, Agent, or Firm*—Staas & Halsey LLP

(57) ABSTRACT

This invention relates to a vacuum vapor-deposition apparatus for forming vapor-deposited films on a base film, thereby to produce vapor-deposited films, and also to a method of producing vapor-deposited films. In the vacuum vapor-deposition apparatus, the synchronizing means equalizes the circumference velocity v1 of the coating roll and the circumference velocity v2 of the takeup guide roll. Hence, v1=v2. Therefore, the takeup guide roll never rubs the vapor-deposited layer provided on the surface of the film. This eliminates the possibility that the vapor-deposited layer has scratches. The vapor-deposited layer can therefore possess desired properties.

3 Claims, 12 Drawing Sheets

FOREIGN PATENT DOCUMENTS

| | | |
|---|---|---|
| JP | 9-195041 | 7/1997 |
| JP | 11-97446 | 4/1999 |
| JP | 11-158630 | 6/1999 |
| JP | 2001-73133 | 3/2001 |
| SU | 1234306 A * | 5/1986 |

OTHER PUBLICATIONS

Chinese Patent Office Action, mailed Apr. 11, 2008 and issued in corresponding Chinese Patent Application No. 2003801074801.

Japanese Patent Office Action, mailed Apr. 22, 2008 and issued in corresponding Japanese Patent Application No. 2002-333839.

* cited by examiner

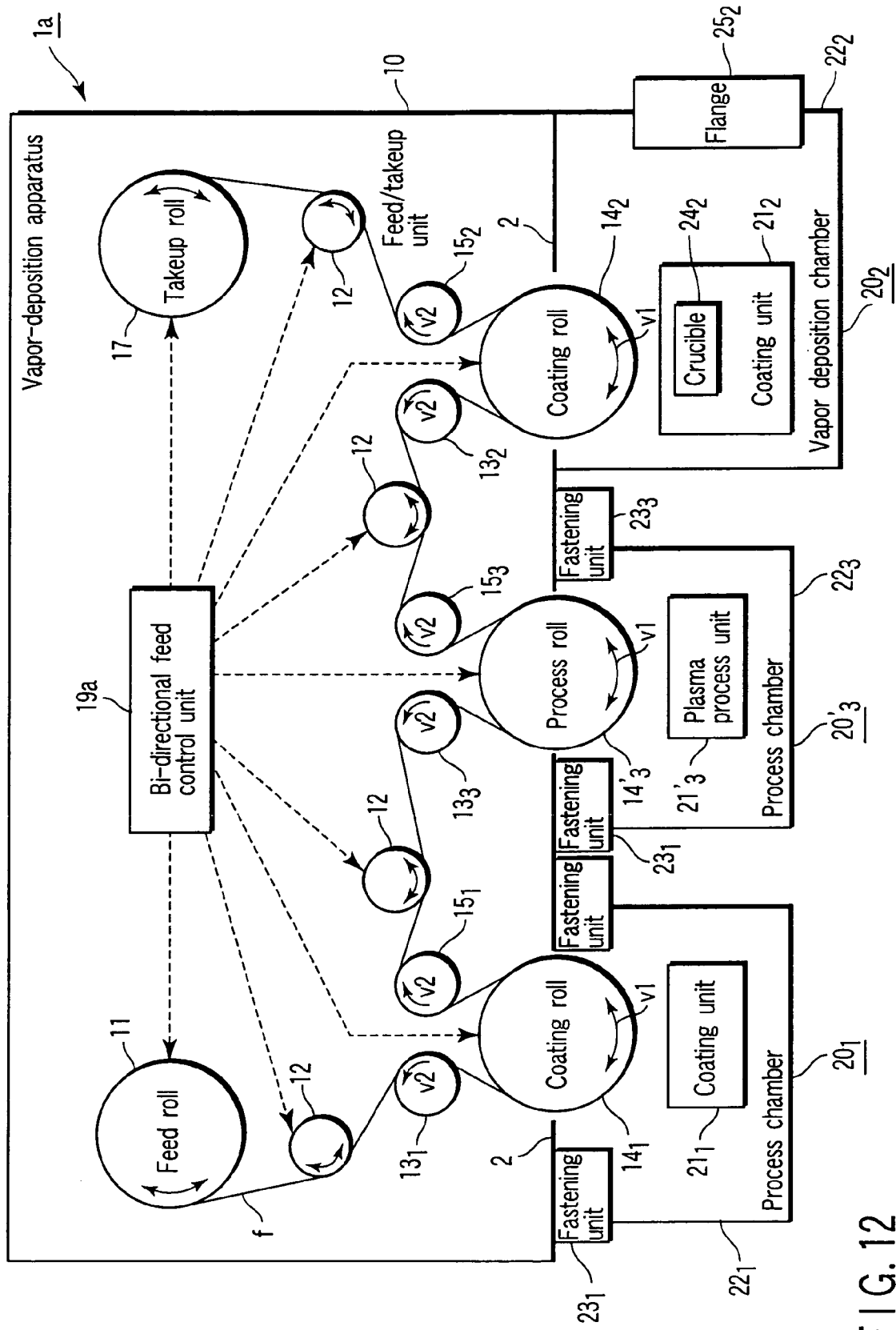
F I G. 12

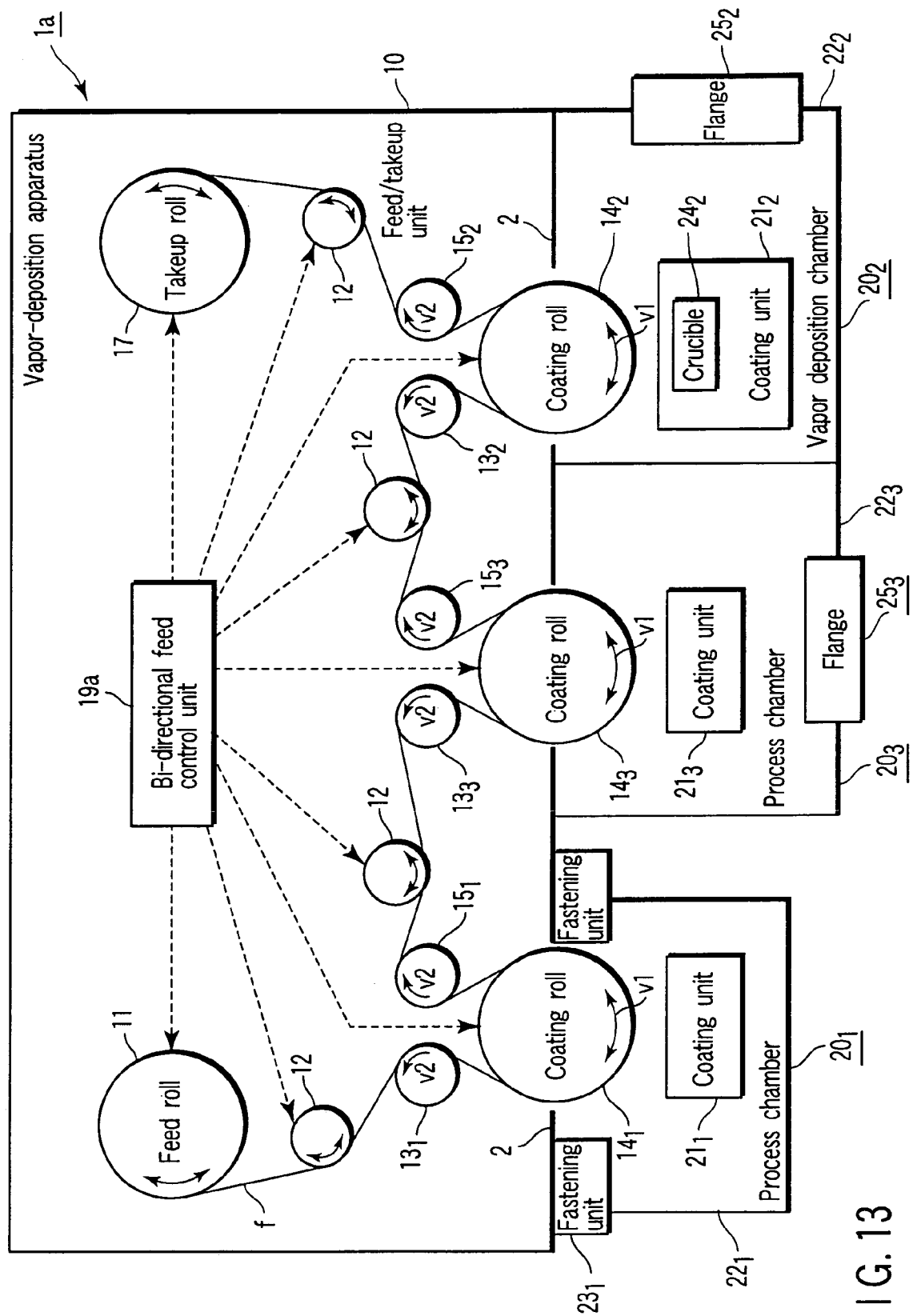
F I G. 13

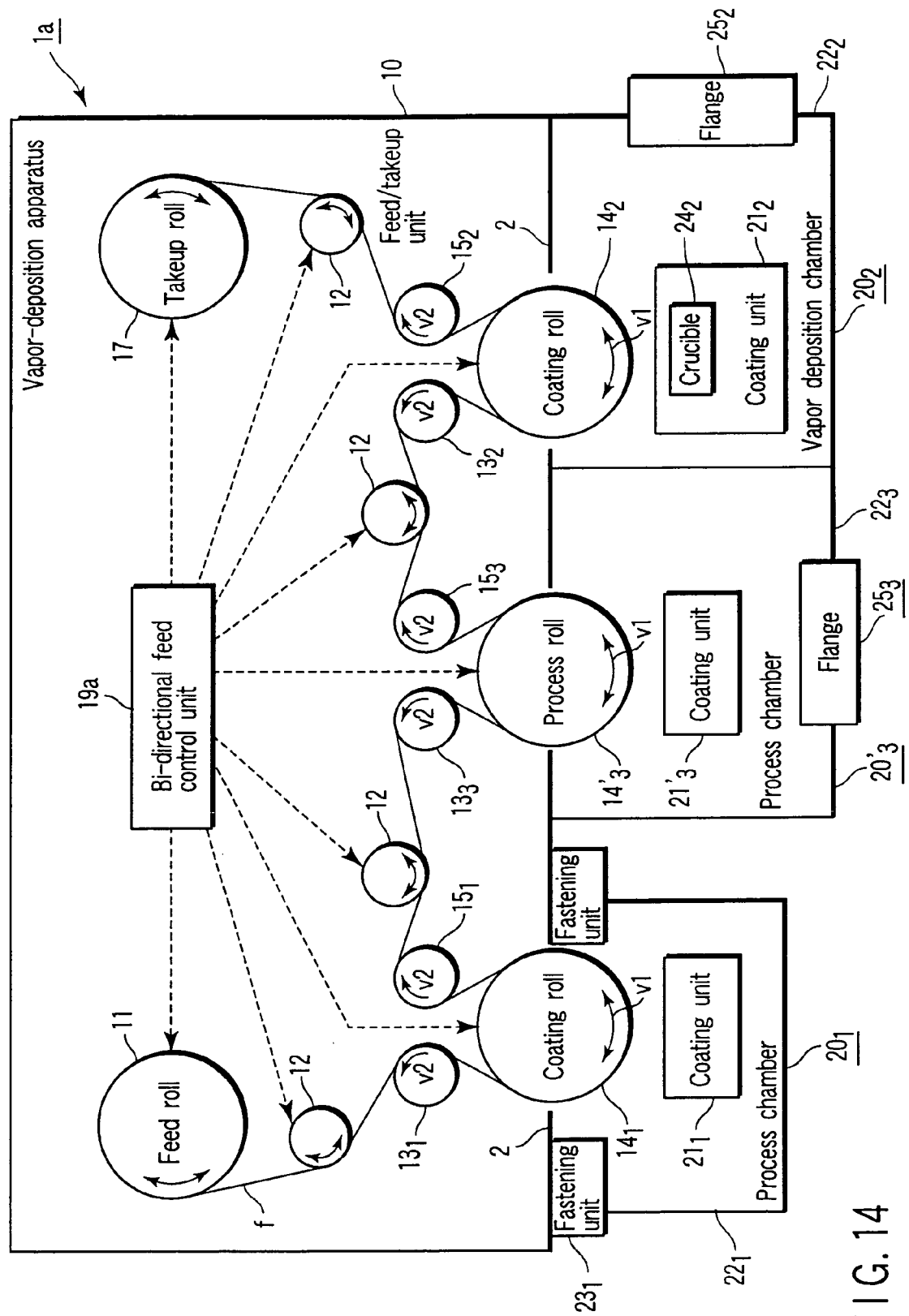
F I G. 14

VACUUM VAPOR-DEPOSITION APPARATUS AND METHOD OF PRODUCING VAPOR-DEPOSITED FILM

CROSS-REFERENCE TO RELATED APPLICATIONS

This is a Continuation Application of PCT Application No. PCT/JP03/16846, filed Dec. 26, 2003, which was published under PCT Article 21(2) in Japanese.

This application is based upon and claims the benefit of priority from prior Japanese Patent Application No. 2002-376933, filed Dec. 26, 2002, the entire contents of which are incorporated herein by reference.

BACKGROUND OF THE INVENTION

1. Field of the Invention

The present invention relates to a vacuum vapor-deposition apparatus for forming vapor-deposited layers on a base film, thereby to produce a vapor-deposited film, and also to a method of producing the vapor-deposited film.

2. Description of the Related Art

Hitherto there are known vacuum vapor-deposition apparatuses that can form, in a vacuum, vapor-deposited layers of metal or the like on base films that are film sheets made of paper, plastics or the like, thereby imparting gas-barrier property and moisture-barrier property to the base films. (See, for example, Jpn. Pat. Appln. KOKAI Publication No. 5-279843.)

A vacuum vapor-deposition apparatus operates, performing the following steps (1) to (3):

(1) Feeding a base film in a vacuum from a feed roll and guiding the base film from a feed guide roll to a coating roll, if necessary by way of a tension roll.

(2) Forming a vapor-deposited layer on the base film that is wrapped around the coating roll.

(3) Taking up the vapor-deposited layer around a takeup roll, if necessary by way of a tension roll, while a takeup guide roll is holding the vapor-deposited layer onto the base film fed from the coating roll.

The feed roll, takeup roll, coating roll and tension rolls are controlled in rotation by motors (not shown), respectively. The other rolls are free rolls, which rotate as the film moves.

The vacuum vapor-deposition apparatus described above has no problems in its usual operation. However, the inventor of the present invention has found that the apparatus should be improved in the following respects.

For example, each roll may rub the vapor-deposited layer formed on the base film while the takeup roll is taking up the film, scratching the vapor-deposited layer. If the vapor-deposited layer has scratches, its desirable properties, such as gas-barrier property and vapor-barrier property, will diminish. In view of this, it seems necessary to improve the apparatus so that it may not make scratches in the vapor-deposited layer.

An object of this invention is to provide a vacuum vapor-deposition apparatus that makes no scratches in a vapor-deposited film, thus preserving the desirable properties of the vapor-deposited film, and also a method of producing a vapor-deposited film that have no scratches.

BRIEF SUMMARY OF THE INVENTION

To achieve the objects described above, vacuum vapor-deposition apparatuses and methods of producing vapor-deposited films, according to the invention are designed as follows.

(1) In a vacuum vapor-deposition apparatus according to this invention, a base film fed from a feed roll is guided in a vacuum from a feed guide roll to a coating roll, a vapor-deposited layer is formed on the base film wrapped around the coating roll, forming a vapor-deposited film, and the vapor-deposited film is taken up around a takeup roll, while a takeup guide roll is holding the vapor-deposited layer of the vapor-deposited film guided from the coating roller. The apparatus comprises a synchronizing means. This means is configured to equalize a circumference velocity $v1$ of the coating roll and the circumference velocity $v2$ of the takeup guide roll. Thus, $v1=v2$.

In the present invention, the synchronizing means equalizes the circumference velocities of the rolls, thus $v1=v2$. Therefore, the takeup guide roll never rubs the vapor-deposited layer provided on the surface of the film. This eliminates the possibility that the vapor-deposited layer has scratches. The vapor-deposited layer can therefore possess desired properties.

(2) In the vacuum vapor-deposition apparatus described in the paragraph (1), the synchronizing means comprises: a first gear which rotates around the axis of the coating roll; a second gear which rotates around the axis of the takeup guide roll; and intermediate gears which are provided in even numbers and which transmit the rotation of the first gear to the second gear.

(3) In the vacuum vapor-deposition apparatus described in the paragraph (1), synchronizing means comprises: a first pulley which rotates around an axis of the coating roll; a second pulley which rotates around an axis of the takeup guide roll; a belt which transmits rotation of the first pulley to the second pulley.

(4) In the vacuum vapor-deposition apparatus described in the paragraph (1), comprising: a motor which rotates the takeup guide roll; and control means which controls the motor so that a number $n2$ of revolutions that the takeup guide roll makes per unit time may become $n1 \cdot (r1/r2)$, where $n1$ is a number of revolutions that the coating roll makes per unit time, $r1$ is a radius of the coating roll, and $r2$ is a number of revolutions that the takeup guide roll.

(5) In the vacuum vapor-deposition apparatus described in the paragraph (1), comprising: a vapor-deposition unit which forms a vapor-deposited layer on the film wrapped around the coating roll; a vapor deposition chamber which contains the vapor-deposition unit and which has an outer wall, at least one part of which is configured to be removed or opened and closed; at least one process roll which is provided at an upstream or downstream side of the coating roll; at least one process unit which performs a coating process or surface treatment on the film wrapped around the process roll, the coating process or surface treatment being one different from the process performed by the vapor-deposition unit; at least one process chamber which contains the process unit and which has an outer wall, at least one part of which is configured to be removed or opened and closed; and a bi-directional feed control unit which feeds the film to the vapor-deposition unit in a forward direction, from the upstream side to the downstream side, or in a reverse direction, from the downstream side to the upstream side.

(6) In the vacuum vapor-deposition apparatus described in the paragraph (5), the vapor-deposition unit performs a PVD method, thus carrying out vapor deposition on the film.

(7) Methods of forming a vapor-deposited film, according to this invention, use the apparatuses described in the paragraphs (1) to (4).

BRIEF DESCRIPTION OF THE SEVERAL VIEWS OF THE DRAWING

FIGS. 12 to 14 are sectional views schematically showing modifications of the sixth embodiment;

DETAILED DESCRIPTION OF THE INVENTION

Embodiments of this invention will be described, with reference to the accompanying drawings. Each of the embodiments that will be described below a synchronizing means that equalizes the circumference velocities v1 and v2 of the coating roll and takeup guide roll, v1=v2. The synchronizing means can therefore solve the problem that vapor-deposited layers may have scratches.

As far as the inventor studied, a vapor-deposited layer has scratches when the circumference velocity v2 of the takeup guide roll that first contacts the layer is lower than the circumference velocity v1 of the coating roll, and the takeup guide roll inevitably rubs the layer. The embodiments are identical in that each has a synchronizing means that prevents the takeup guide roll from rubbing the vapor-deposited layer, and are different in that their synchronizing means differ in structure, as will be described below.

First Embodiment

Figure 1:
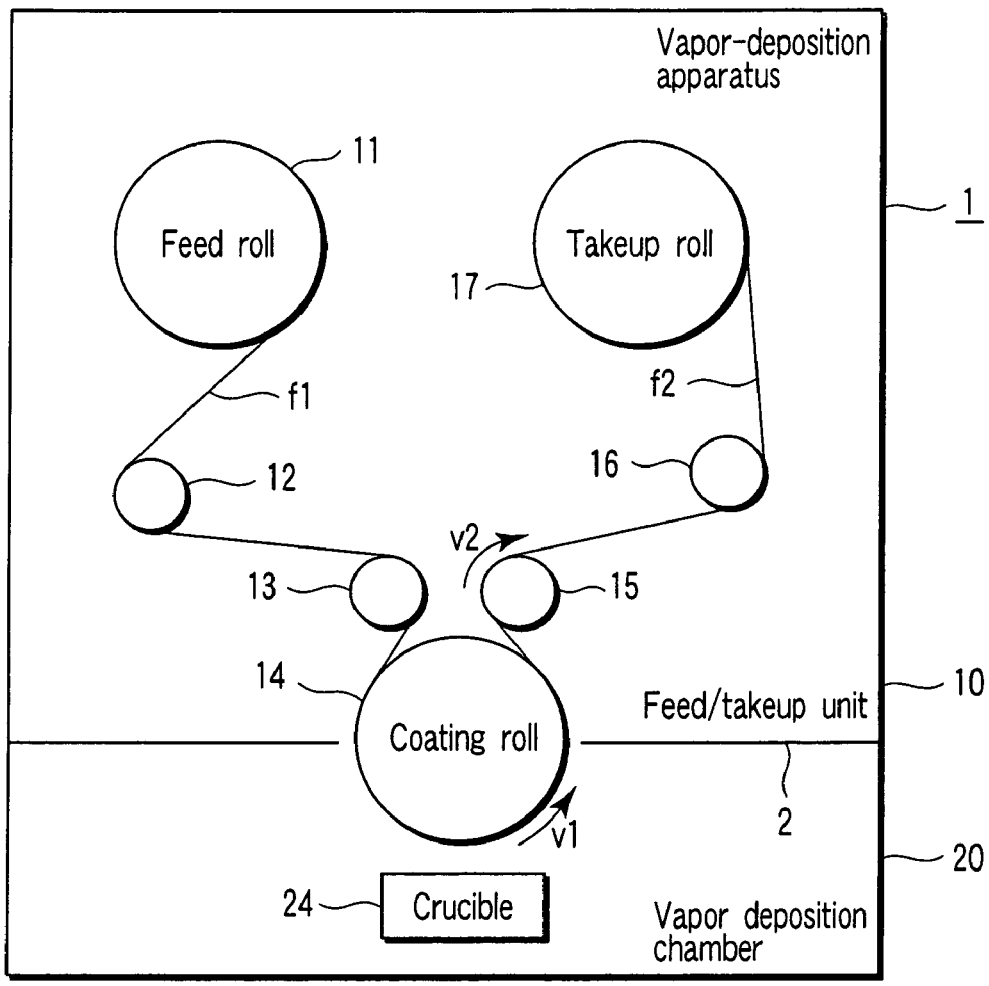
FIG. 1 is a sectional view schematically showing a vacuum vapor-deposition apparatus according to a first embodiment of the present invention.
Figure 2:
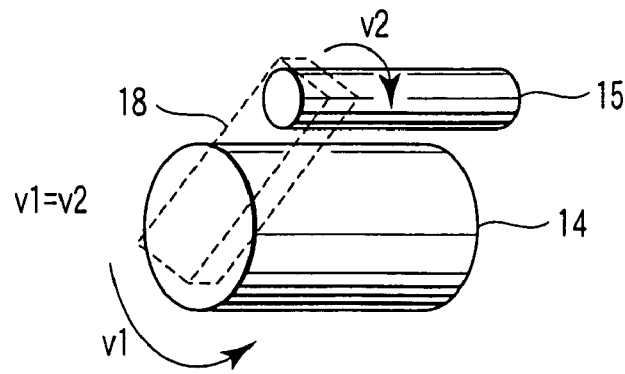
FIG. 2 is a schematic diagram illustrating some components of the vacuum vapor-deposition apparatus according to the first embodiment.

FIG. 1 is a sectional view that schematically shows a vacuum vapor-deposition apparatus 1 according to the first embodiment of this invention. FIG. 2 is a schematic diagram depicting some components of this vacuum vapor-deposition apparatus 1. The vacuum vapor-deposition apparatus 1 forms a vapor-deposited layer of silicon oxide or the like on one surface of a base film f1 made of paper, plastics or the like, thereby producing a vapor-deposited film f2 that possesses gas-barrier property and vapor-barrier property. As FIG. 1 shows, the apparatus 1 has a partition wall 2, a feed/takeup unit 10, and a vapor deposition chamber 20. The unit 10 and the chamber 20 are separated from each other with the partition wall 2.

The feed/takeup unit 10 is a chamber from which the base film f1 is fed into the vapor deposition chamber 20, and into which the base film f1 is guided from the vapor deposition chamber 20. The unit 10 comprises a feed roll 11, a feed tension roll 12, a feed guide roll 13, a coating roll 14, a takeup guide roll 15, a takeup tension roll 16, a takeup roll 17, and a synchronizing means 18.

A length of base film f1 is wound around the feed roll 11. To produce a vapor-deposited film, the base film f1 is fed from the feed roll 11 to the feed tension roll 12.

The feed tension roll 12 guides the base film f1 to the feed guide roll 13, while adjusting the tension exerted on the base film f1 being fed from the feed roll 11. If necessary, additional feed tension rolls (not shown) may be arranged on a film-feeding path.

The feed guide roll 13 is located near the coating roll 14. It guides the base film f1 being supplied from the feed tension roll 12, to the coating roll 14.

The coating roll 14 is arranged, with one part opposed to the crucible 24 that is provided in the vapor deposition chamber 20. The coating roll 14 guides the base film f1 from the feed guide roll 13 into the vapor deposition chamber 20, and guides a vapor-deposited film f2 having a vapor-deposited layer toward the takeup guide roll 15. The coating roll 14 can rotate at circumference velocity v1, because its rotational speed (i.e., revolutions per minute) is controlled by a control device (not shown).

The takeup guide roll 15 is located near the coating roll 14. This is the roll that first contacts the vapor-deposited layer after the vapor-deposited film f2 is fed from the coating roll 14. The takeup roll 15 guides the vapor-deposited film f2 to the takeup tension roll 16. More precisely, the takeup roll 15 contacts the surface of the vapor-deposited layer of the vapor-deposited film f2; it is a roll other than the takeup roll 17. In view of this, three takeup guide rolls 15 are usually provided. Hence, it is desired that the synchronizing means 18, which will be later described, should make the circumference velocities v2 of all rolls that contact the vapor-deposition layer, equal to the circumference velocity v1 of the coating roll 14.

The phrase "located near the coating roll 14" means that the takeup guide roll 15 is positioned at a distance of, for example, 15 mm to 50 mm from the roll 14. Alternatively, the roll 15 may be at a distance of 50 mm to 100 mm. This specification describes only those features of the feed/takeup unit 10, which help to describe the synchronizing means 18.

The synchronizing means 18 controls the takeup guide roll 15. Controlled by the means 18, the takeup guide roll 15 rotates at circumference velocity v2 that is equal to the circumference velocity v1 of the coating roll 14. Thus, the takeup guide roll 15 can guide the vapor-deposited film f2 to the takeup tension roll 16, without making scratches in the surface of the vapor-deposited layer of the vapor-deposited film f2.

The takeup tension rolls 16 and, if necessary, additional takeup tension rolls (not shown) are arranged on the film-feeding path. The takeup tension rolls feed the vapor-deposited film f2 from the takeup guide roll 15 to the takeup roll 17, while adjusting the tension exerted on the vapor-deposited film f2.

The takeup roll 17 takes up the vapor-deposited film f2 being guided from the takeup tension rolls 16.

The synchronizing means 18 is configured to equalize the circumference velocities v1 and v2 of the coating roll 14 and takeup guide roll 15, v1=v2. The synchronizing means 18 may be one of the following three types (a) to (c):

(a) Gears are used to equalize the circumference velocities v1 and v2. For example, some gears selected from the group consisting of a spur gear, a helical gear, a bevel gear, a screw gear, a worm and a worm wheel are employed in combination.

(b) Belts are utilized to equalize the circumference velocities v1 and v2. For example, some belts selected from the group consisting of a V belt, a timing belt, a synchronous belt and the like are used in combination. Some of the belts used may be replaced by chains.

(c) A rotation control unit and a motor M2 for driving the takeup guide roll 15 are employed. The motor M2 is provided in addition to the motor M1 that drives the coating roll 14. The rotation control unit controls the rotation of the motor M2.

The vapor deposition chamber 20 contains the crucible 24, which in turn contains the material to be vapor-deposited on the base film f1. The vapor deposition chamber 20 is a chamber, in which an electron gun (not shown) applies an electron beam to the material contained in the crucible 24, evaporating the material and forming a vapor-deposited layer on the base film f1 being guided by the coating roll 14.

The vapor deposition performed in the vapor deposition chamber 20 may be either physical vapor deposition (PVD) or chemical vapor deposition (CVD). If PVD is selected, it may be resistance heating, induction heating or electron-beam heating.

A method of manufacturing a vapor-deposited film, which the vacuum vapor-deposition apparatus described above performs, will be explained.

In the vacuum vapor-deposition apparatus 1, the base film f1 is fed in a vacuum from the feed roll 11 and guided to the coating roll 14 by way of the feed tension roll 12.

The coating roll 14 guides the base film f1 into the vapor deposition chamber 20 and guides the base film vapor-deposited film f2 to the takeup guide roll 15. The film f2 has a vapor-deposited layer that is formed on one surface of the base film f1.

The takeup guide roll 15 guides the vapor-deposition film f2 to the takeup tension rolls 16, while holding the vapor-deposited layer onto the base film f1.

At this time, the synchronizing means 18 equalizes the circumference velocities v1 and v2 of the coating roll 14 and takeup guide roll 15. Thus, v1=v2.

The velocity v1 at which the vapor-deposited film is guided is equal to the circumference velocity v2 of the roll 15 that first contacts the vapor-deposited layer. Hence, the vapor-deposited layer never rubs the takeup guide roll 15. Therefore, the takeup guide roll 15 guides the vapor-deposited film f2 to the takeup tension roll 16, without scratching the vapor-deposited layer.

Thereafter, the takeup tension roll 16 guides the vapor-deposited film f2 to the takeup roll 17. The takeup roll 17 takes up the vapor-deposited film f2. A roll of vapor-deposited film f2 is produced when the entire length of the film f2 obtained by processing the base film f1 fed from the feed roll 11, in the vapor deposition chamber, is taken up around the takeup roll 17 in its entirety.

As indicated above, the synchronizing means 18 equalizes the circumference velocities v1 and v2 of the coating roll 14 and takeup guide roll 15, thus v1=v2, in the present embodiment. Hence, the takeup guide roll 15 would not rub the vapor-deposited layer of the vapor-deposited film f2. This eliminates the possibility that the vapor-deposited layer has scratches. The vapor-deposited layer can therefore possess desired properties.

Second Embodiment

Figure 3:
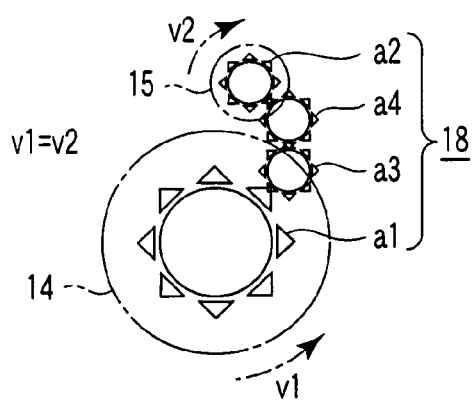
FIG. 3 is a schematic diagram depicting a synchronizing means that may be used in a vacuum vapor-deposition apparatus according to a second embodiment of this invention.

FIG. 3 is a schematic diagram that depicts a synchronizing means that may be used in a vacuum vapor-deposition apparatus according to the second embodiment of this invention. The components that are identical to those shown in FIG. 1 are designated at the same reference numerals and will not be described in detail. Mainly, the components different will be described. Other embodiments will be later described, not explaining any component that is identical to the corresponding component shown in FIG. 1.

This embodiment is a specific example of the first embodiment. The synchronizing means 18 is of the type (a), comprising gears.

The synchronizing means 18 comprises a first gear a1, a second gear a2, and two intermediate gears a3 and a4. The first gear a1 rotates around the axis of the coating roll 14. The second gear a2 rotates around the axis of the takeup guide roll 15. The intermediate gears a3 and a4 transmit the rotation of the first gear a1 to the second gear a2.

The gears a1 to a4 are spur gears. Instead, they may be any other types that are mentioned above.

The number of the intermediate gears used is not limited to two. Rather, any even number of intermediate gears can be used. Thus, the coating roll 14 and the takeup guide roll 15 rotate in the opposite direction, not in the same directions. So far as the rolls 14 and 15 rotate in the opposite direction, an odd number of gears may be utilized, if they are arranged in a specific manner. Note that the "odd number" means "0," too (that is, the intermediate gears a3 and a4 are not used at all, and a force is transmitted from first gear a1, directly to the second gear a2).

The first gear a1, second gear a2 and intermediate gears a3 and a4 have a specific number of teeth each, so that n2=n1 (r1/r2). Here, r1 is the radium of the coating roll 14, r2 is the radius of the takeup guide roll 15, n1 is the number of revolutions that the first gear a1 makes per unit time, and n2 is the number of revolutions that the second gear a2 makes per unit time.

The synchronizing means of this configuration can equalizes the circumference velocities v1 and v2 of the coating roll 14 and takeup guide roll 15, thus v1=v2. Hence, the second embodiment can achieve the same advantage as the first embodiment.

Third Embodiment

Figure 4:
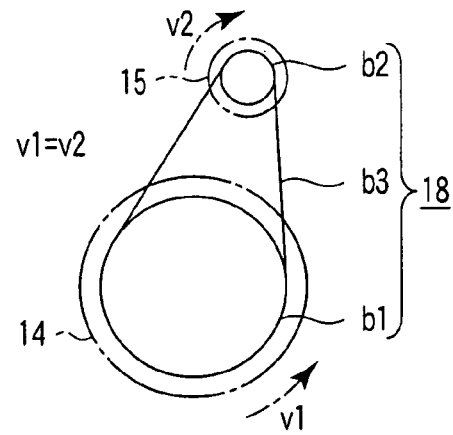
FIG. 4 is a schematic diagram illustrating a synchronizing means that may be incorporated in a vacuum vapor-deposition apparatus according to a third embodiment of the invention.

FIG. 4 is a schematic diagram that illustrates a synchronizing means that may be incorporated in a vacuum vapor-deposition apparatus according to the third embodiment of the invention.

The embodiment is a specific example of the first embodiment. The synchronizing means 18 is of the type (b), comprising belts.

This synchronizing means 18 comprises a first pulley b1, a second pulley b2 and a belt b3.

The first pulley b1 has a radius r1', which is k times the radius r1 of the coating roll 14 (for example, $0.4 < k \leq 1$). The pulley b1 rotates around the axis of the coating roll 14.

The second pulley b2 has a radius r2' that is k times the radius r2 of the takeup guide roll 15. The pulley b2 rotates around the axis of the takeup guide roll 15.

The radius r1' of the pulley b1 and the radius r2' of the pulley b2 are the same value k. Thus, both pulleys b1 and b2 and both rolls 14 and 15 are similar in shape. As a result, the circumference velocities v1 and v2 of the rolls 14 and 15 are equal; v1=v2.

The belt b3 transmits a force of the first pulley b1 that is rotating, to the second pulley b2. The belt b3 can be any one of the types specified above.

The synchronizing means 18 of this configuration can equalizes the circumference velocities v1 and v2 of the coating roll 14 and takeup guide roll 15, thus v1=v2. Hence, the third embodiment can achieve the same advantage as the first embodiment.

Figure 5:
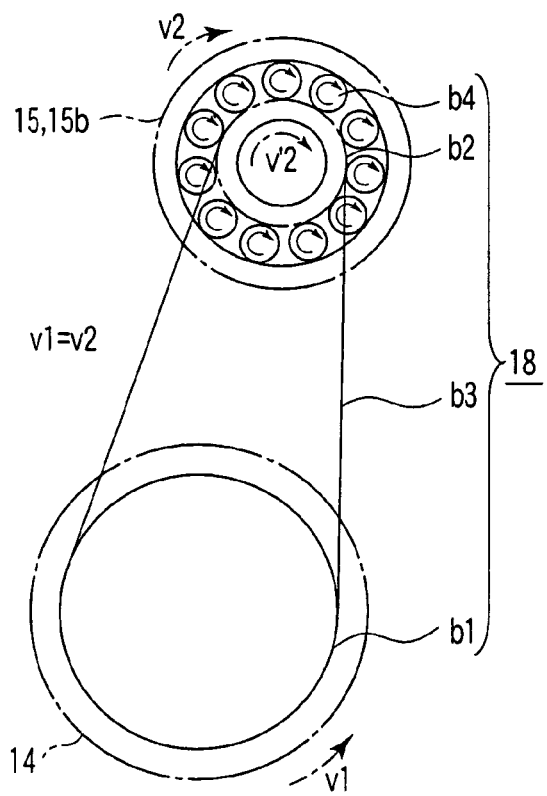
FIG. 5 is a schematic diagram showing a modification of the synchronizing means used in the third embodiment.

This embodiment may be modified as illustrated in FIG. 5. More specifically, the takeup guide roll 15 may be a tendency roll 15b, and the synchronizing means 18 may include a plurality of ball bearings b4.

The ball bearings b4 are arranged, each contacting the outer circumferential surface of the second pulley b2 and the inner circumferential surface of the tendency roll 15b. They are balls that can rotate and revolve.

The tendency roll 15b serves as takeup guide roll 15 and receives, via the ball bearings b4, the force of the second pulley b2 that is rotating.

In the modified synchronizing means 18 shown in FIG. 5, the velocity v2' of the second pulley b2 may differ from the circumference velocity v1 of the coating roll 14. Even in this case, the ball bearings b4 reduce or absorb the velocity differential. The rotation of the coating roll 14 is transmitted to the tendency roll 15b (i.e., takeup guide roll 15). Hence, the synchronizing means can equalizes the circumference velocities v1 and v2 of the coating roll 14 and takeup guide roll 15, thus v1=v2, as described above.

Fourth Embodiment

Figure 6:
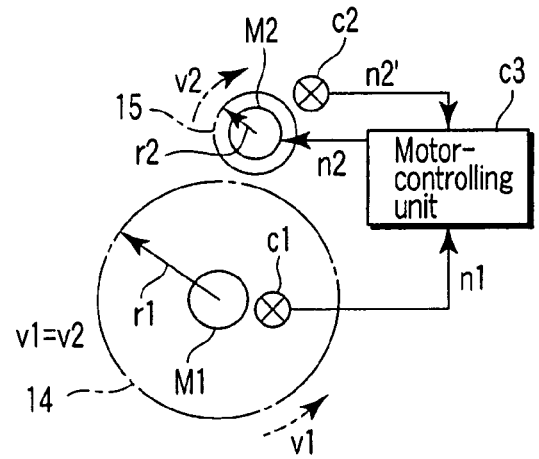
FIG. 6 is a schematic diagram depicting a synchronizing means that may be used in a vacuum vapor-deposition apparatus according to a fourth embodiment of this invention.

FIG. 6 is a schematic diagram that depicts a synchronizing means that may be used in a vacuum vapor-deposition apparatus according to the fourth embodiment of this invention.

The fourth embodiment is a specific example of the first embodiment. The synchronizing means 18 used in this embodiment is the type (c) that comprises a motor controller.

The synchronizing means 18 comprises a motor M2, a first rotation meter c1, a second rotation meter c2, and a motor-controlling unit c3.

The motor M2 operates independently of the motor M1 that rotates the coating roll 14. It is controlled by the motor-controlling unit c3, to rotate the takeup guide roll 15.

The first rotation meter c1 measures the number n1 of revolutions the coating roll 14 makes per unit time. The meter c1 supplies data representing the number n1, to the motor-controlling unit c3.

The second rotation meter c2 measures the number n2' of revolutions the takeup guide roll 15 makes per unit time. The meter c2 supplies data representing the number n2', to the motor-controlling unit c3.

In accordance with the data items supplied from the meters c1 and c2, which represent the numbers n1 and n2', respectively, the motor-controlling unit c3 controls the motor M2 so that the number n2 of revolutions that the takeup guide roll 15 makes per unit time may become n1 (r1/r2), that is, n2=n1 (r1/r2).

The synchronizing means 18 of this configuration can equalizes the circumference velocities v1 and v2 of the coating roll 14 and takeup guide roll 15, thus v1=v2. Hence, the fourth embodiment can achieve the same advantage as the first embodiment.

This invention is not limited to the embodiments described above. In practice, various changes and modifications can be made, without departing from the scope and spirit of the invention.

In the fourth embodiment, for example, the motor-controlling unit c3 may receive the data representing the number n1 of revolutions from a unit (not shown) for controlling the motor M1, not from the first rotation meter c1 as described above.

The number n1 of revolutions is a measured value. Instead, it may be a preset value. Further, the first rotation meter c1 may be modified to measure the number of revolutions that the motor M1 makes per unit time, if the number n1 of revolutions that the coating roll 14 makes per unit time is equal to the number of revolutions that the motor M1 makes per unit time (that is, if the roll 14 is mounted on the shaft of the motor M1). The number n2 of revolutions may be a set value as the number n1.

The rotation meters c1 and c2 are not limited to those that measure numbers n1 and n2 of revolutions. They may be modified to measure the circumference velocities v1 and v2 directly. In this case, the motor-controlling unit c3 needs only to control the motor M2 so v1=v2, not n2=n1 (r1/r2).

These various modifications can be applied not only to the fourth embodiment, but also to the first, second and third embodiments.

Fifth to Seventh Embodiments

The fifth to seventh embodiments, which will be described below, have one of the synchronizing means 18 that have been described in conjunction with the first to fourth embodiments. They further comprise a process unit that which performs vapor deposition or surface treatment and which can be replaced by a process unit of a different type.

The background art to the fifth to seventh embodiments will be explained first.

A two-head coater system is known in the field of vapor deposition apparatuses. This system performs vapor deposition on a film being continuously supplied in a vacuum, forming two or more layers on the film in a single step. (See, for example, Jpn. Pat. Appln. Publication No. 8-311650.) No problems arise with this vacuum vapor-deposition apparatus in its operation. However, the inventor hereof has found, upon studying this apparatus, that the apparatus does not seem to improve the gas-barrier property or vapor-barrier property, because vapor-deposited layers are formed by the same process, one upon another.

The fifth to seventh embodiments are can not only attain the advantages of the first to fourth embodiments, but also can improve the properties of vapor-deposited layers.

To improve the properties of vapor-deposited layers, the fifth to seventh embodiments use a process unit that performs a coating process or surface treatment. This process unit is provided in addition to the vapor deposition unit, i.e., physical vapor deposition (PVD) unit.

The study of the inventor hereof shows that the properties of vapor-deposited layers cannot be so much improved because the layers are formed, one upon another, by the vapor deposition method (PVD method). This is why the fifth to seventh embodiments has a process unit that performs a coating process or surface treatment that is different from the PVD method, in addition to the physical vapor deposition (PVD) unit. Hence, the fifth to seventh embodiments differ in respect to the process units and the other components peripheral thereto. The fifth to seventh embodiments will be described below.

Fifth Embodiment

Figure 7:
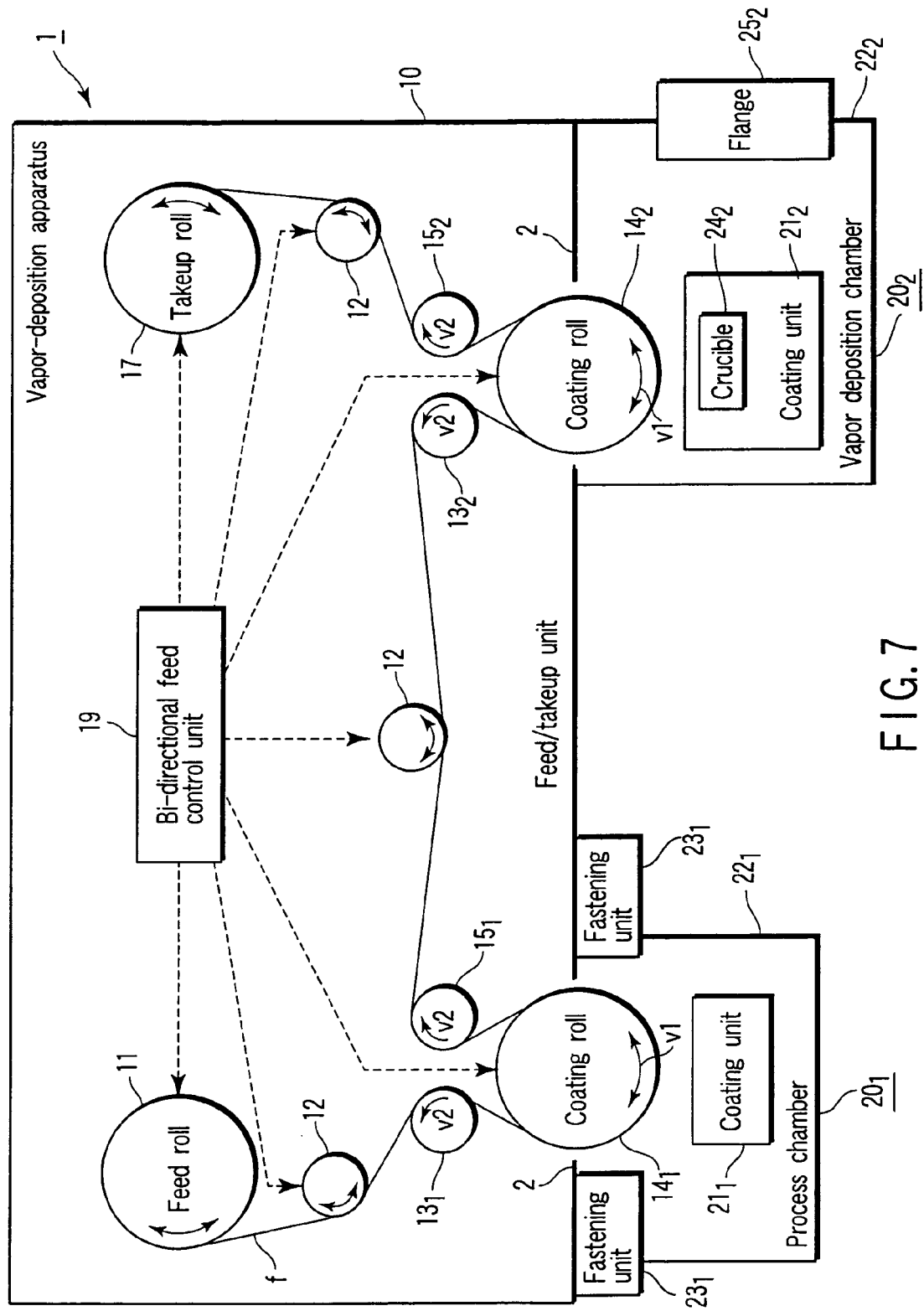
FIG. 7 is a sectional view schematically illustrating a vacuum vapor-deposition apparatus according to a fifth embodiment of the present invention.

FIG. 7 is a sectional view schematically illustrating a vacuum vapor-deposition apparatus according to the fifth embodiment of the present invention. This vacuum vapor-deposition apparatus 1 is designed to form vapor-deposited layers, such as aluminum layer, aluminum oxide layer and silicon oxide layer, on a film f made of paper (web), plastics or the like, thus imparting gas-barrier property and moisture-barrier property to the film f. As FIG. 7 shows, the apparatus 1 has a partition wall 2, a feed/takeup unit 10, a process chamber $20_1$, and a vapor deposition chamber $20_2$. The unit 10, process chamber $20_1$ and vapor deposition chamber $20_2$ are separated from one another with the partition wall 2.

The feed/takeup unit 10 is a chamber from which the film f is fed into the process chamber $20_1$, and into which the film f is guided from the vapor deposition chamber $20_2$. The unit 10 comprises a feed roll 11, a plurality of tension rolls 12, first guide rolls $13_1$ and $13_2$, coating rolls $14_1$ and $14_2$, second guide rolls $15_1$ and $15_1$, a takeup roll 17, and a bi-directional feed control unit 19. Note that the suffixes "1" and "2" pertain to the units, respectively, for not only this embodiment but also the embodiments that will be described later.

A length of film f is wound around the feed roll 11. To produce a vapor-deposited film, the base film f1 is fed from the feed roll 11 to the adjacent feed tension roll 12, under the control of the bi-directional feed control unit 19. The film f is taken up from the other tension roll 12 next to the first-mention one. The film f will be finally taken up to the tension roll 12 next to the second-mentioned one, after layers have been formed on it.

Several tension rolls 12 are arranged on a film-feeding path. Controlled by the bi-directional feed control unit 19, the tension rolls 12 adjust the tension exerted on the film f while the film f is fed from one roll to another (that is, from roll 11 to roll $13_1$, from roll $15_1$ to roll $13_2$, from roll $15_2$ to roll 17).

The first guide rolls $13_1$ and $13_2$ are arranged near the coating rolls $14_1$ and $14_2$, respectively. Controlled by the bi-directional feed control unit 19, the first guide roll $13_1$ guides the film f from the tension roll 12 to the coating roll $14_1$ or from the coating roll $14_1$ to the tension roll 12, and the other first guide roll $13_2$ guides the film f from the other tension roll 12 to the coating roll $14_2$ or from the coating roll $14_2$ to the other tension roll 12.

The coating rolls $14_1$ and $14_2$ are arranged, opposed at one part to the process chamber $20_1$ and the vapor deposition chamber $20_2$, respectively. Controlled by the bi-directional feed control unit 19, the coating rolls $14_1$ guides the film f from the first guide roll $13_1$ into the process chamber $20_1$ and guides the film 1 having a thin film layer to the second guide roll $15_1$, and the coating rolls $14_2$ guides the film f from the first guide roll $13_2$ into the vapor deposition-chamber $20_2$ and guides the film f having a vapor-deposited layer to the second guide roll $15_2$. Further, the coating roll $14_1$ can guide the film f from the second guide roll $15_1$ into the process chamber $20_1$ and can guide the film 1 having a thin film layer to the first guide roll $13_1$. The coating roll $14_2$ can guide the film f from the second guide roll $15_2$ into the vapor deposition chamber $20_2$ and can guide the film 1 having a vapor-deposited layer to the first guide roll $13_2$.

The second guide rollers $15_1$ and $15_2$ are arranged near the coating rolls $14_1$ and $14_2$, respectively. Controlled by the bi-directional feed control unit 19, the second guide rollers $15_1$ and $15_2$ guide the film f from the coating rollers $14_1$ and $14_2$, and guide the film f from the tension rolls 12 back to the coating rollers $14_1$ and $14_2$.

The takeup roll 17 takes up the film f guided from the next tension roll 12. In the process of forming a vapor-deposited film on the film f, the takeup roll 17 takes up and feeds the film f from and to the next tension roll 12 under the control of the bi-directional feed control unit 19. Ultimately, the takeup roll 17 takes up the film f from the next tension roll 12 after layers have been formed on the film f.

The bi-directional feed control unit 19 is designed to feed the film f to and from coating units $22_1$ and $22_2$, which will be described later. That is, the unit 19 can feed the film f in the forward direction, "from the upstream side to the downstream side," and also in the reverse direction, "from the downstream side to the upstream side." More specifically, the unit 19 controls the feed roll 11, tension rolls 12, first guide rolls $13_1$ and $13_2$, coating rolls $14_1$ and $14_2$ and second guide rolls $15_1$ and $15_2$, rotating them in two directions.

The process chamber $20_1$ contains a coating unit $21_1$, which performs a coating process on the film f wrapped around one coating roll $14_1$. The coating process is different from the PVD method. The outer wall $22_1$ of the process chamber $20_1$ is attached to the feed/takeup unit 10 by the fastening unit $23_1$. The process chamber $20_1$ can be detached from the feed/takeup unit 10. The coating process, which differs from the PVD method, is, for example, chemical vapor deposition (CVD), organic vapor deposition, vapor-deposition/polymerization, sputtering, or the like.

The vapor deposition chamber $20_2$ contains a coating unit (vapor-deposition unit) $21_2$, which performs a vapor-deposition process, or PVD, on the film f wrapped around the other coating roll $14_2$. The vapor deposition chamber $20_2$ has an outer wall $22_2$, a part of which is a flange $25_2$ that can be opened and closed. The outer wall $22_2$ is attached to the partition wall 2 of the feed/takeup unit 10.

The coating unit $21_2$ contains a crucible $24_2$ that holds the material to be deposited by means of the PVD method. An evaporation means, such as an electron gun (not shown), evaporates the material held in the crucible $24_2$, thereby to form a vapor-deposited layer on the surface of the film f rapped around the coating roll $14_2$. The PVD method may be resistance heating, induction heating, or electron-beam heating, or the like.

The flange $25_2$, which is a part of the outer wall $22_2$, can be removed and can be opened and closed. Usually it closes the vapor deposition chamber.

The chambers $20_1$ and $20_2$ may be arranged on the upstream and downstream sides, respectively, or vice versa, since the film f can be fed in two directions.

The vacuum vapor-deposition apparatus, thus configured, operates as will be described blow.

In the vacuum vapor-deposition apparatus 1, the film f fed from the feed roll 11 in a vacuum is guided from the first guide rolls $13_1$ to the coating roll $14_1$ by way of the tension roll 12.

The coating roll $14_1$ feeds the film f into the process chamber $20_1$. In the process chambers $20_1$, a thin layer is formed on the surface of the film f. The film f is then guided to the second guide rolls $15_1$.

The second guide rolls $15_1$ guides the film f to the tension roll 12, while contacting the thin layer provided on the surface of the film f.

The tension roll 12 guides the film f from the first guide roll $13_2$ into the coating roll $14_2$.

The coating roll $14_2$ guides the film f into the vapor deposition chamber $20_2$ that performs the PVD method. In the chamber $20_2$, a vapor-deposited layer is formed on the surface of the film f. The coating roll $14_2$ further guides the film f to the second guide roll $15_2$.

The second guide rolls $15_2$ guides the film f to the tension roll 12, while contacting the vapor-deposition layer provided on the surface of the film f.

The tension roll 12 guides the film f to the takeup roll 17. The takeup roll 17 takes up the film f. When two layers are formed on the entire length of film f in the process chambers $20_1$ and the vapor deposition chamber $20_2$, respectively, and the entire length of film f is taken up around the takeup roll 17, a roll of film f is produced.

Thereafter, the film f may be fed from the takeup roll 17 and taken up around the feed roll 11. In this case, the coating unit $21_1$ or the coating unit $21_2$, or both can perform a coating process on the film f under the control of the bi-directional feed control unit 19.

The outer wall $22_1$ of the process chamber $20_1$ may be detached, and the coating unit $21_1$ may be replaced by a unit that performs a different coating process. Then, a thin layer of a specific quality can be formed by the different process, on the film f.

If the coating unit $21_1$ or the coating unit $21_2$, or both, repeatedly perform a coating process on the film f that is being fed in two directions by the bi-directional feed control unit 19, the film f will have a plurality of thin layers of composite quality, laid one upon another.

Inorganic vapor-deposited layers (layers of metal or inorganic oxide), layers formed by another process, for example, organic silicon oxide layers formed by the CVD method, and organic layers formed by organic vapor deposition can be provided, one upon another. This can provide a multi-layer film f has better gas-barrier property and moisture-barrier property than the films hitherto known.

As described above, in this embodiment, the coating unit $21_1$ performs a coating process on the film f in a single step, said process being different from the process that the other coating unit $21_2$ carries out on the film f. The present embodiment can therefore improve the properties of vapor-deposited layers.

The bi-directional feed control unit 19 enables the coating unit $21_1$ or the coating unit $21_2$, or both, to perform the respective processes over again. This helps to attain the above-mentioned advantage easily. In addition, the advantage can be more easily achieved if the outer wall $22_1$ of the process chamber $20_1$ is detached and if the coating unit $21_1$ is replaced by a unit that perform a different coating process. All coating processes are continuously carried out in a vacuum, forming thin layers. No natural oxide films are formed between the thin layers. This can promise the production of high-quality films.

As indicated above, one coating unit $20_2$ performs the PVD method. The resultant film can be improved in quality, because the PVD film has high quality.

This embodiment may be modified as will be explained with reference to FIGS. 8 to 10.

Figure 8:
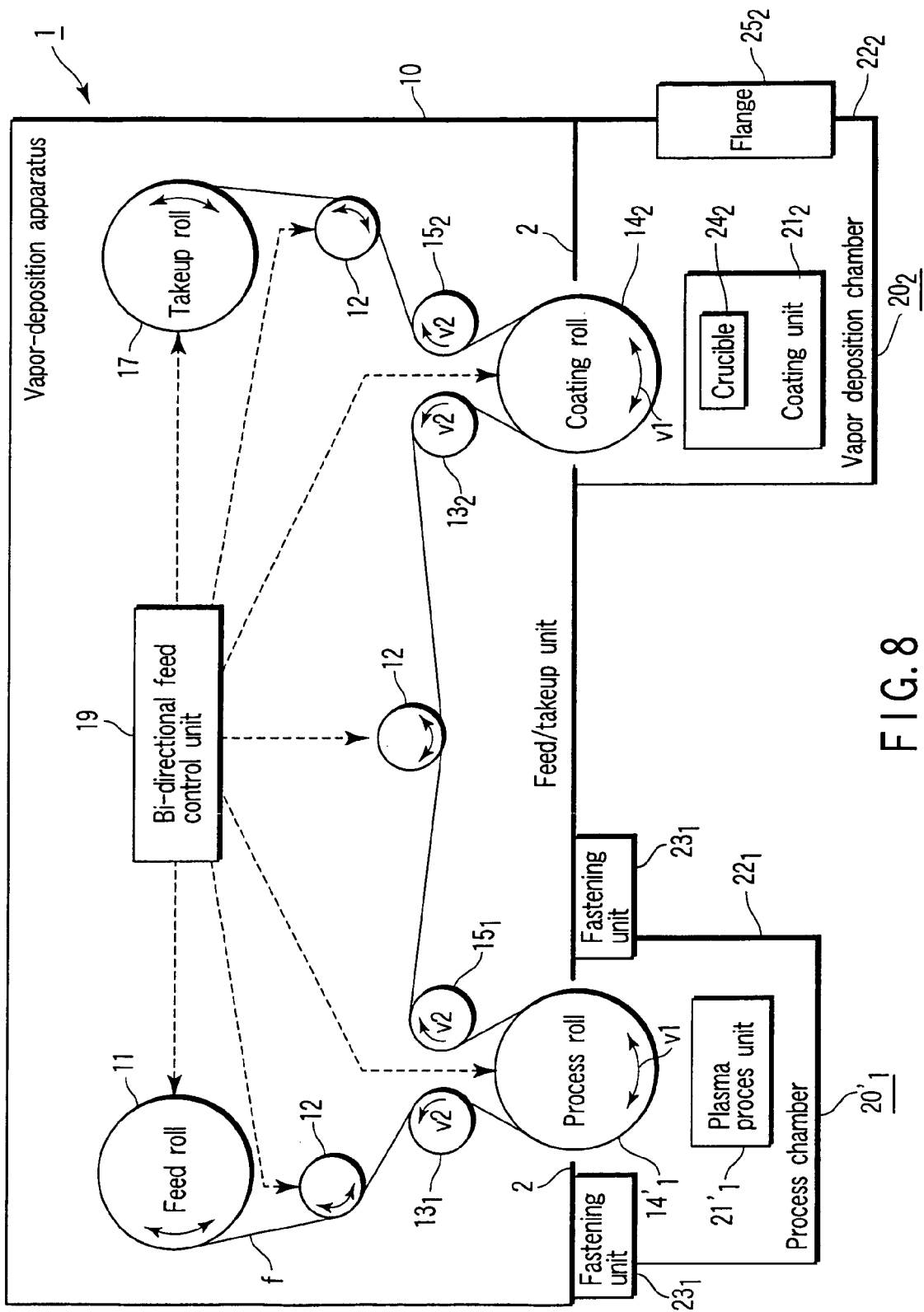
FIGS. 8 to 10 are sectional views schematically showing modifications of the fifth embodiment.

As shown in FIG. 8, the coating unit $21_1$ that performs a coating process may be replaced by a plasma process unit $21_1'$, which is provided in a process chamber $20_1'$. The unit $21_1'$ carries out plasma process that is a surface treatment.

Figure 9:
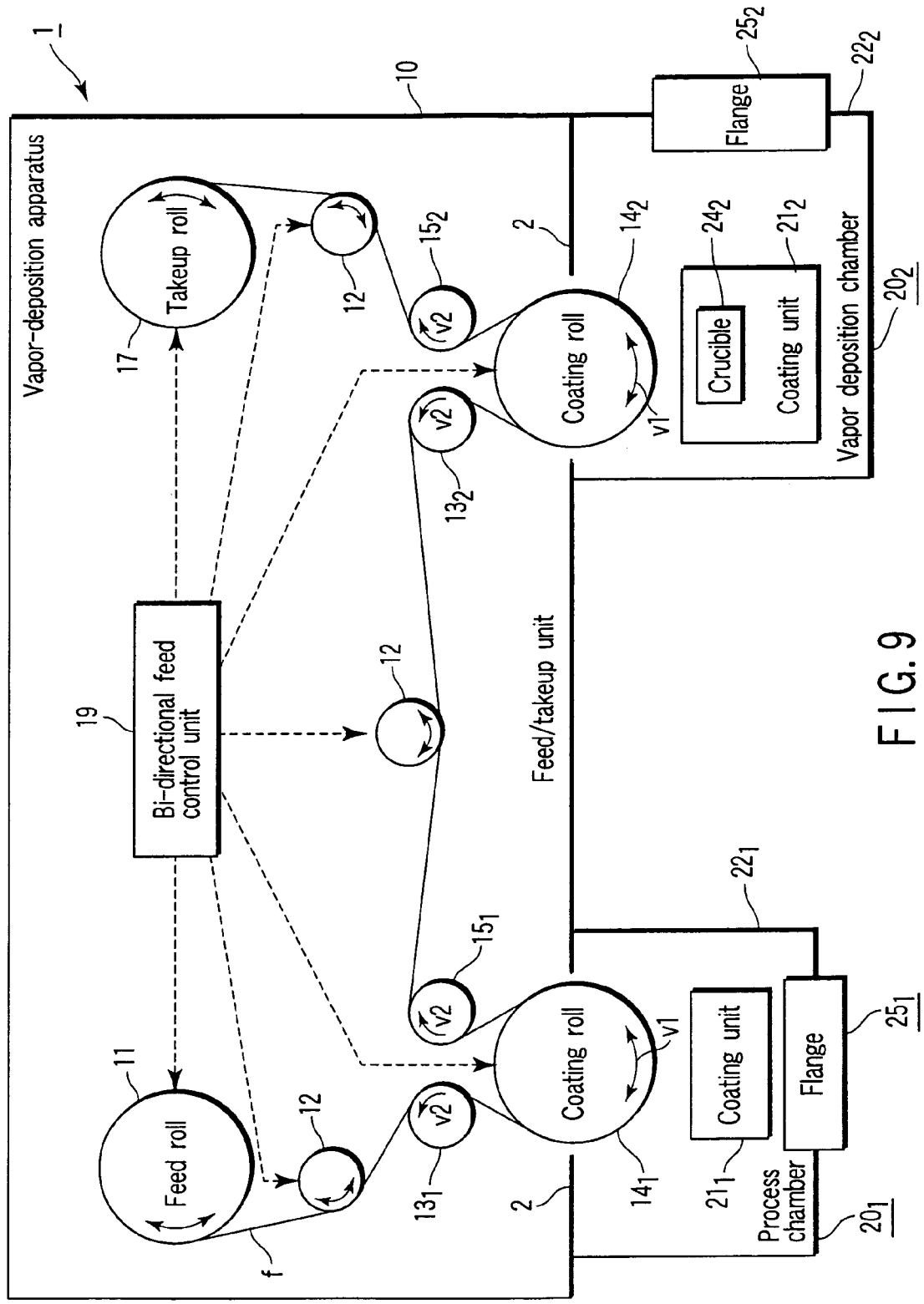
Figure 10:
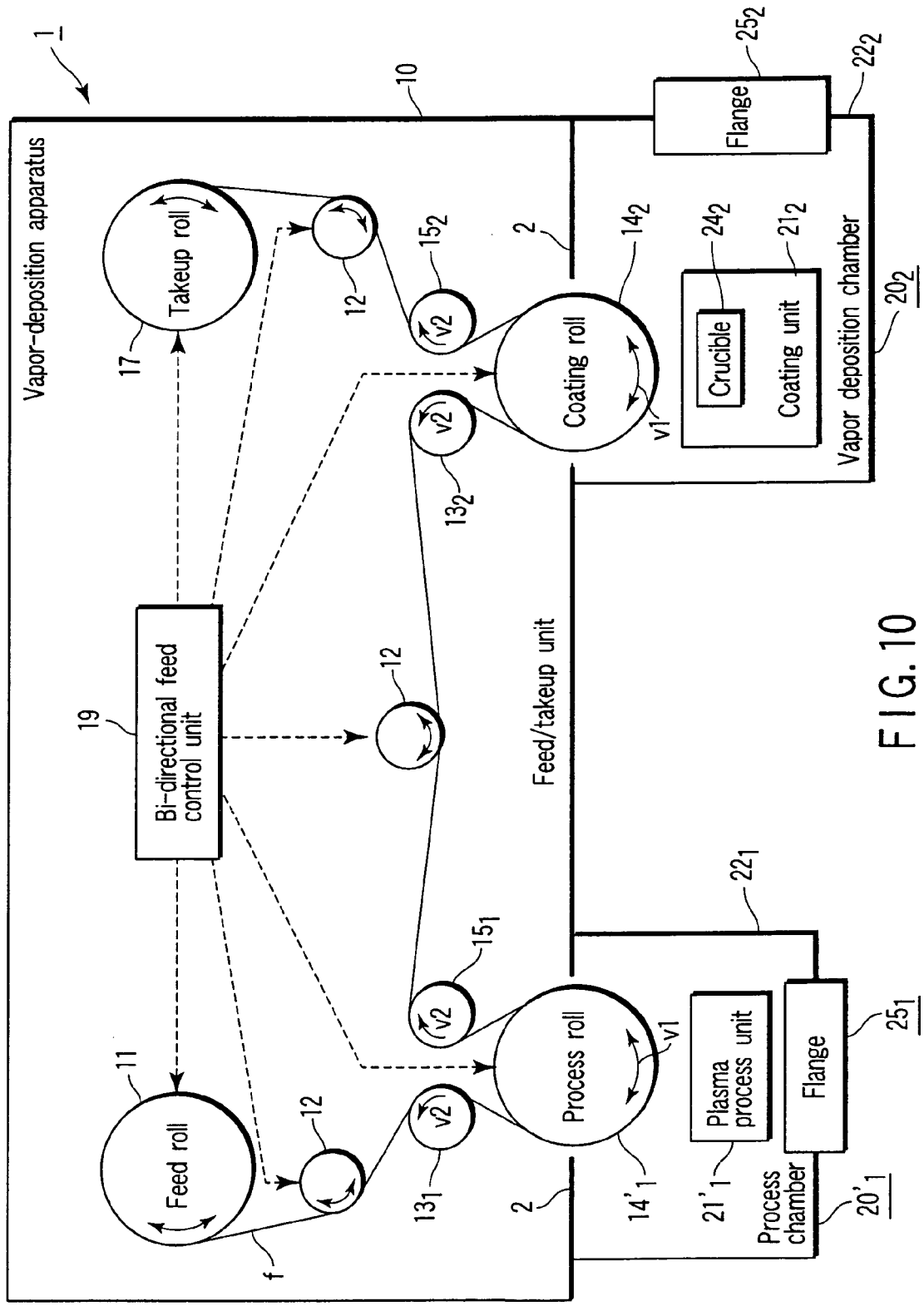

Alternatively, as FIG. 9 or FIG. 10 shows, the fastening unit $23_1$ that attaches and detaches the outer wall $22_1$ may be replaced by a flange $22_1$ that can attach and detach and closes the same. In this case, the flange $22_1$ needs to have such a size that the unit $21_1$ and $21_1'$ can be exchanged respectively.

Sixth Embodiment

Figure 11:
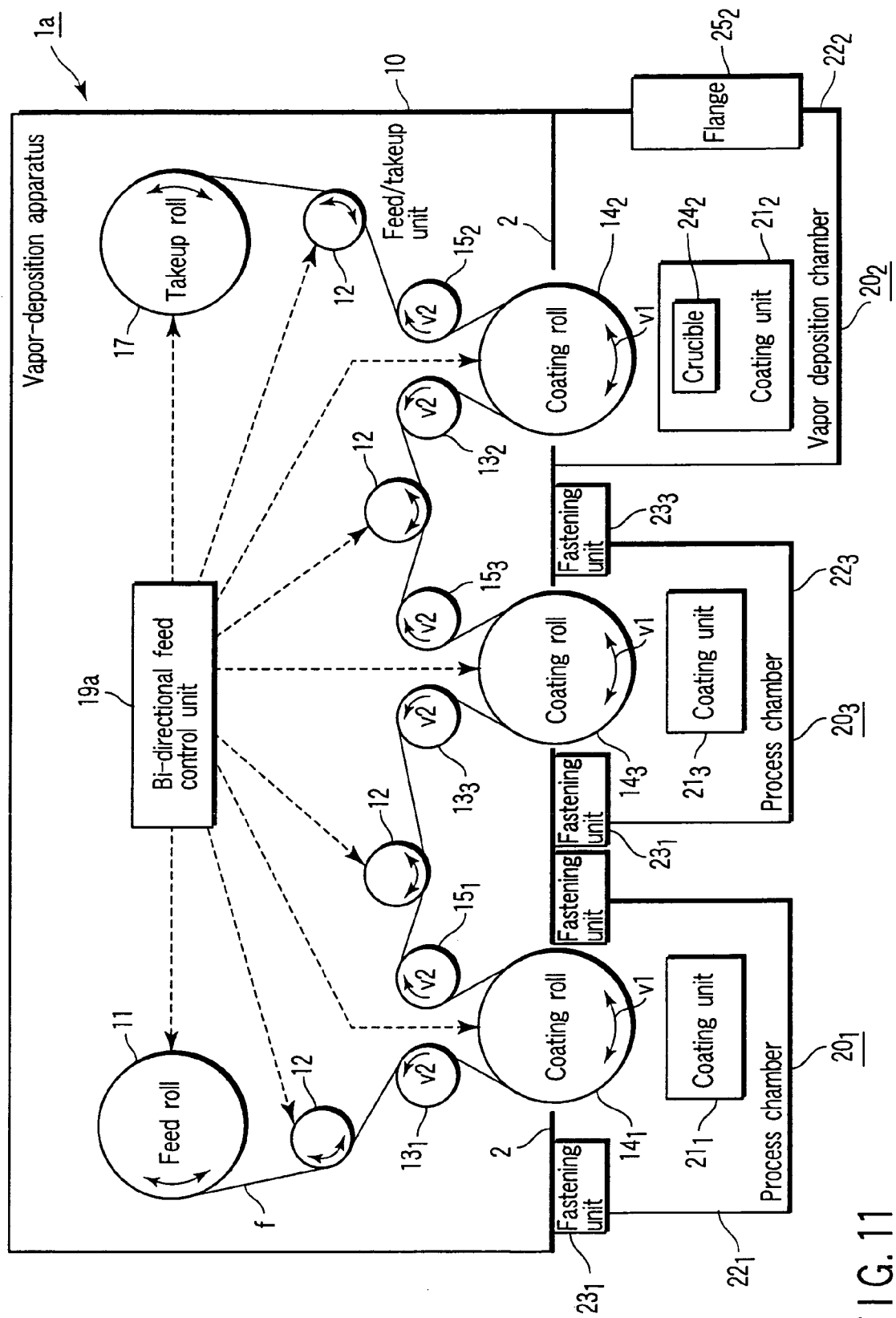
FIG. 11 is a sectional view schematically illustrating a vacuum vapor-deposition apparatus according to a sixth embodiment of this invention.

FIG. 11 is a sectional view schematically illustrating a vacuum vapor-deposition apparatus according to the sixth embodiment of the present invention.

This embodiment is a modification of the fifth embodiment. It has another process chamber $20_3$ on the film-feeding path. This process chamber $20_3$ contains a coating unit $21_3$.

The coating unit $21_3$ may be one that is configured to perform a coating process different from the PVD method. The may be of the same type as the coating unit $21_1$ described above. Nonetheless, it should better be different from the coating unit $21_1$, because thin layers of various qualities are formed in this embodiment.

Thus constructed, the sixth embodiment can achieve the same advantages as the fifth embodiment. Moreover, it can improve the quality of the film f, thanks to the specific coating process that the coating unit $21_3$ carries out.

The number of process chambers, such as chambers $20_1$ and $20_3$, is not limited to one or two. Rather, process chambers can be provided in any desired numbers. Further, this embodiment may be modified as is illustrated in FIGS. 12 to 14.

That is, as shown in FIG. 12, the process chamber $20_3$ may be replaced by a process chamber $20'_3$ that contains a plasma process unit $21'_3$, not the coating unit $21_3$.

Alternatively, as FIGS. 13 and 14 show, the fastening unit $23_1$ that attaches and detaches the outer wall $22_1$ may be replaced by a flange $25_1$ that can attach and detach a part of the outer wall $22_1$, or can open and closes the same.

Seventh Embodiment

Figure 15:
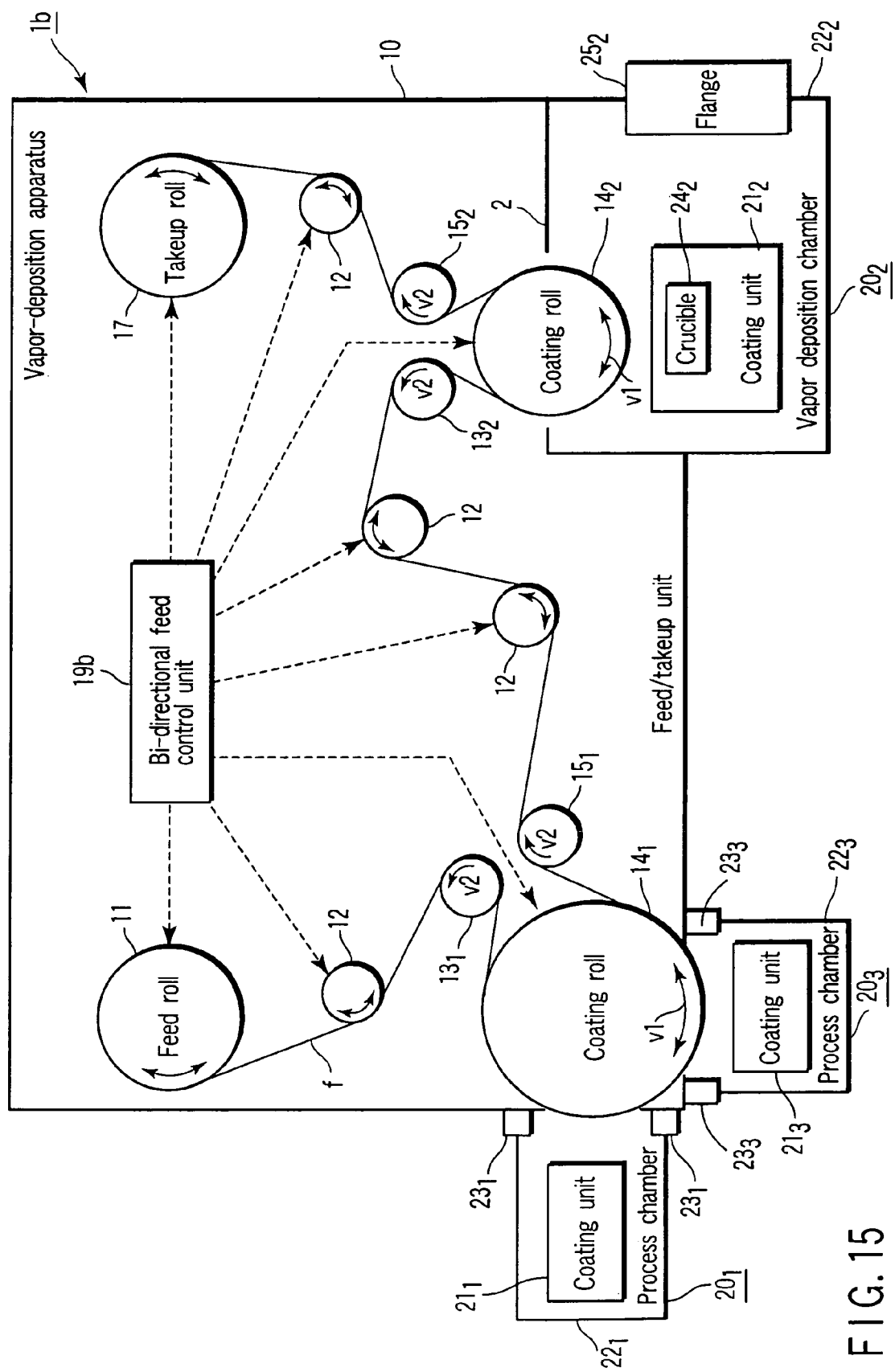
FIG. 15 is a sectional view schematically depicting a vacuum vapor-deposition apparatus according to a seventh embodiment of the invention.

FIG. 15 is a sectional view schematically depicting a vacuum vapor-deposition apparatus according to the seventh embodiment of the invention.

The present embodiment is a modification of the sixth embodiment. The process chamber $20_3$ is opposed to the coating roll $14_1$, like the process chamber $20_1$.

Thus constructed, the seventh embodiment can achieve the same advantages as the sixth embodiment. Moreover, it can improve the quality of the film f, because appropriate coating processes can be performed in combination, respectively by two coating units $21_1$ and $21_2$, to form thin layers.

Figure 16:
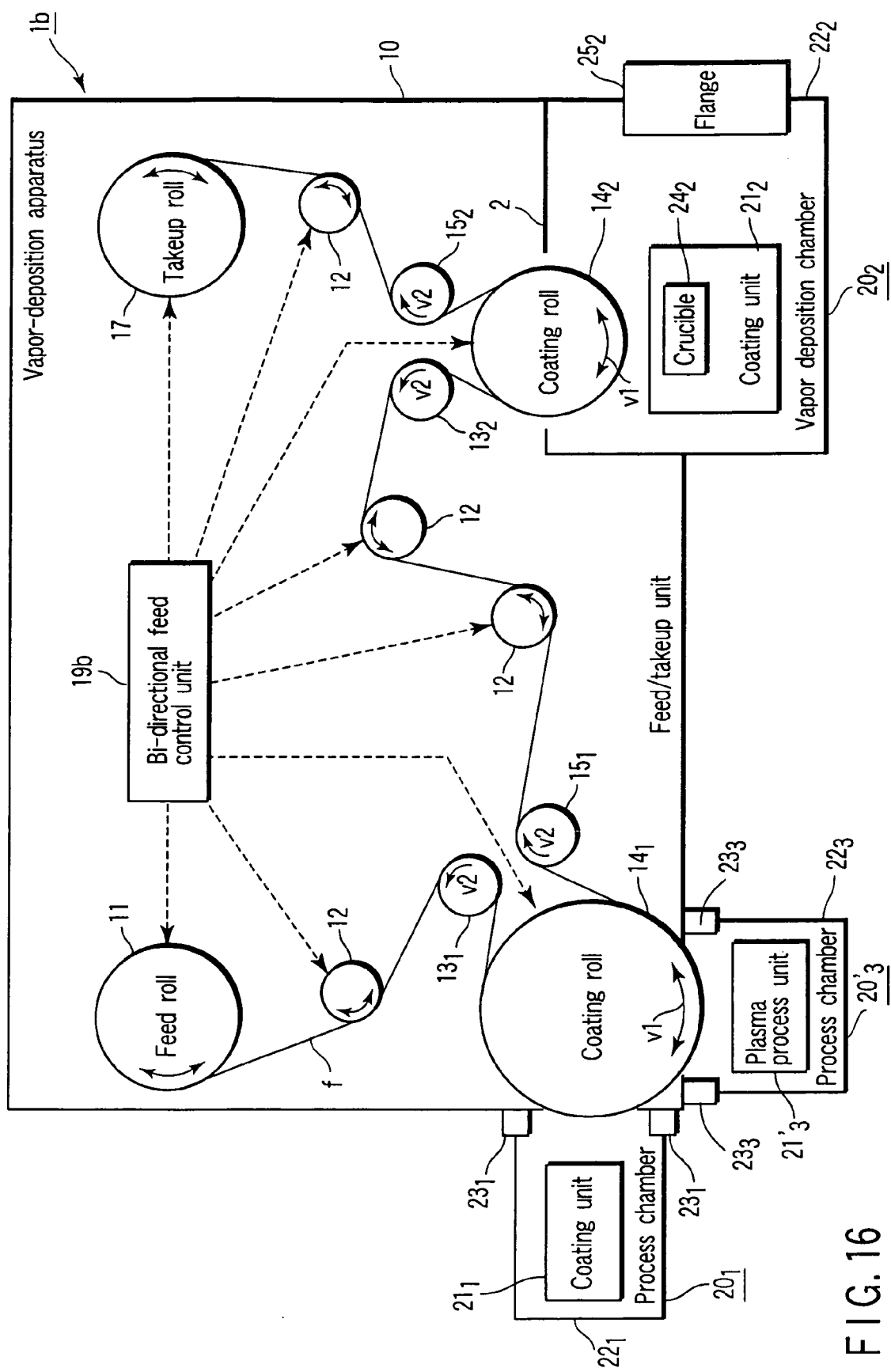
FIG. 16 is a sectional view that schematically shows a modification of the seventh embodiment.

The seventh embodiment may be modified, too, as is illustrated in FIG. 16. More precisely, the process chamber $20_3$ may be replaced by a process chamber $20'_3$ that contains a plasma process unit $21'_3$, not the coating unit $21_3$. If this is the case, the plasma process unit neutralizes the thin layer formed by the coating unit $21_1$ described above. Namely, a coating process and a surface treatment are carried out at a single coating roll, i.e., the roll $14_1$. Nevertheless, it is possible to improve the thin layer in terms of quality.

The present invention is not limited to the embodiments described above. Various changes and modifications can be made in any embodiment, without departing from the scope or spirit of the invention. The embodiments described above may be combined in any possible way, to achieve specific advantages.

For example, any process chambers 20 selected from the group consisting of the chambers $20_1$, $20_1'$, $20_3$ and $20_3'$ may be arranged at given positions on the film-feeding path.

Further, each embodiment described above includes various phases of the invention. The components disclosed herein may be combined in various ways to make various inventions. Even if some components of any embodiment described above are not used, components known in the art may be used instead to reduce this invention to practice.

Further, any other changes and modifications can be made, without departing from the scope and spirit of the present invention.

The present invention can provide a vacuum vapor-deposition apparatus that makes no scratches in a vapor-deposited film, thus preserving the desirable properties of the vapor-deposited film. Also, the invention can provide a method of producing a vapor-deposited film that have no scratches.

What is claimed is:

1. A vacuum vapor-deposition apparatus in which a base film fed from a feed roll is guided in a vacuum from a feed guide roll to a coating roll, a vapor-deposited layer is formed on the base film wrapped around the coating roll, forming a vapor-deposited film, and the vapor-deposited film is taken up around a takeup roll, while a takeup guide roll is holding the vapor-deposited layer of the vapor-deposited film guided from the coating roll, the apparatus comprising:

synchronizing means which is configured to equalize a circumference velocity v1 of the coating roll and a circumference velocity v2 of the takeup guide roll, thus v1=v2 the circumference velocity of the coating roll is equal to the circumference velocity of the takeup guide roll, wherein the takeup guide roll is a tendency roll;

the synchronizing means includes a first pulley, which rotates around an axis of the coating roll, a second pulley, which rotates around an axis of the takeup guide roll, a belt, which transmits rotation of the first pulley to the second pulley, and a plurality of ball bearings, each contacting an outer circumferential surface of the second pulley and an inner circumferential surface of the tendency roll, and the tendency roll receives a force of the second pulley that is rotating, via the ball bearings.

2. The vacuum vapor-deposition apparatus according to claim 1, comprising:

a vapor-deposition unit which forms the vapor-deposited layer on the base film wrapped around the coating roll;

a vapor deposition chamber which contains the vapor-deposition unit and which has an-outer wall, at least one part of which is configured to be removed or opened and closed;

at least one process roll which is provided at an upstream or a downstream side of the coating roll;

at least one process unit which performs a coating process or surface treatment on the base film wrapped around the process roll, the coating process or the surface treatment being one different from a process performed by the vapor-deposition unit;

at least one process chamber which contains the process unit and which has an outer wall, at least one part of which is configured to be removed or opened and closed; and a bi-directional feed control unit which feeds the base film to the vapor-deposition unit in a forward direction, from the upstream side to the downstream side, or in a reverse direction, from the downstream side to the upstream side.

3. The vacuum vapor-deposition apparatus according to claim 2, wherein vapor-deposition unit performs a physical vapor deposition (PVD) method, thus carrying out vapor deposition on the base film.

* * * * *